United States Patent [19]

Chen

[11] Patent Number: 5,738,961
[45] Date of Patent: Apr. 14, 1998

[54] TWO-STEP PHOTOLITHOGRAPHY METHOD FOR ALIGNING AND PATTERNING NON-TRANSPARENT LAYERS

[75] Inventor: Jeng-Horng Chen, Taipei, Taiwan

[73] Assignee: Taiwan Semiconductor Manufacturing Company, Ltd., Hsin-Chu, Taiwan

[21] Appl. No.: 805,878

[22] Filed: Mar. 3, 1997

[51] Int. Cl.⁶ .............................. G03F 9/00; G03F 7/36
[52] U.S. Cl. .................... 430/22; 430/316; 430/317; 430/318; 430/323; 438/975; 148/DIG. 102
[58] Field of Search .......................... 430/22, 316, 317, 430/318, 323; 148/DIG. 102; 438/975

[56] References Cited

U.S. PATENT DOCUMENTS

| | | | |
|---|---|---|---|
| 4,125,418 | 11/1978 | Vinton | 148/DIG. 102 |
| 5,128,283 | 7/1992 | Tanaka | 438/975 |
| 5,270,255 | 12/1993 | Wong | 437/194 |
| 5,456,756 | 10/1995 | Ramaswami et al. | 118/721 |

*Primary Examiner*—Christopher G. Young
*Attorney, Agent, or Firm*—George O. Saile; Stephen B. Ackerman; Alek P. Szecsy

[57] ABSTRACT

A method for forming a patterned non-transparent layer over a substrate. There is first provided a substrate which has an alignment mark formed thereupon. There is then formed over the substrate including the alignment mark a blanket non-transparent layer. The blanket non-transparent layer only partially replicates the alignment mark to yield upon the blanket non-transparent layer a partially replicated alignment mark at a location substantially corresponding with the location of the alignment mark formed upon the substrate. There is then removed through a first photolithographic and etch method a first portion of the blanket non-transparent layer to completely expose the alignment mark while simultaneously forming a partially patterned non-transparent layer. The first photolithographic and etch method employs the partially replicated alignment mark to register a first photolithographic mask with respect to the substrate. Finally, there is then formed through a second photolithographic and etch method a patterned non-transparent layer from the partially patterned non-transparent layer. The second photolithographic and etch method employs the alignment mark to register a second photolithographic mask with respect to the substrate. The method is particularly useful for forming patterned conductor metal layers with optimal overlay registration within integrated circuits.

16 Claims, 3 Drawing Sheets

TWO-STEP PHOTOLITHOGRAPHY METHOD FOR ALIGNING AND PATTERNING NON-TRANSPARENT LAYERS

BACKGROUND OF THE INVENTION

1. Field of the Invention

The present invention relates generally to methods for forming patterned non-transparent layers, such as but not limited to patterned conductor metal layers, within microelectronic fabrications such as but not limited to integrated circuit fabrications. More particularly, the present invention relates to methods for forming patterned non-transparent layers, such as but not limited to patterned conductor metal layers, with optimal overlay registration within microelectronic fabrications such as but not limited to integrated circuit fabrications.

2. Description of the Related Art

Integrated circuits are formed from semiconductor substrates within and upon whose surfaces are formed resistors, transistors, diodes and other electrical circuit elements. The electrical circuit elements are connected internally and externally to the semiconductor substrate upon which they are formed through patterned conductor layers which are separated by dielectric layers.

In the process of forming patterned layers, such as but not limited to patterned conductor layers, patterned semiconductor layers and patterned insulator layers, within microelectronic fabrications, such as but not limited to integrated circuit fabrications, it is common in the art of microelectronic fabrication to employ alignment marks formed upon a substrate, such as but not limited to a semiconductor substrate, in order to provide a means for registering the substrate with respect to a series of photolithographic masks employed in defining a series of patterned layers upon the substrate such that the patterned layers are formed with optimal overlay registration with respect to the substrate. While the use of alignment marks as a means for providing optimal overlay registration of patterned layers with respect to substrates employed within microelectronic fabrications has become quite common in the art of microelectronics fabrication, the use of alignment marks as a means for providing optimal overlay registration of patterned layers within respect to substrates upon which are formed those patterned layers within microelectronic fabrications is not without problems.

In particular, it is common in the art of microelectronics fabrication that alignment marks when formed upon a substrate upon which there is desired to be formed a patterned non-transparent layer, such as but not limited to a patterned conductor metal layer, will at least partially loose resolution of those alignment marks when a blanket non-transparent layer from which is desired to form the patterned non-transparent layer, such as a blanket conductor metal layer from which is desired to be formed the patterned conductor metal layer, is formed over the substrate. Such partial loss of resolution of alignment marks derives from: (1) an inability to optically directly sense an alignment mark upon which is formed a non-transparent layer; and (2) lateral inhomogeneities typically encountered when forming a partially replicated alignment mark within the non-transparent layer at the location of the alignment mark formed upon the substrate. In situations where there is formed upon the substrate a blanket non-transparent layer which is simultaneously or subsequently planarized, such as a blanket conductor layer which is thermally reflowed or polished to form a planarized blanket conductor layer, resolution of an alignment mark formed upon a substrate beneath the planarized non-transparent layer is completely lost.

With regard more specifically to the art of integrated circuit fabrication, various methods and apparatus have been disclosed in the art of integrated circuit fabrication to avoid loss of resolution of alignment marks formed upon semiconductor substrates when there is formed upon those semiconductor substrates blanket non-transparent layers, such as blanket conductor metal layers.

For example, Ramaswami et al., in U.S. Pat. No. 5,456,756 disclose a semiconductor substrate holding apparatus, a semiconductor substrate metal deposition apparatus and a semiconductor substrate processing method which preserve topographical alignment marks formed upon a semiconductor substrate when forming upon the semiconductor substrate a blanket conductor metal layer. There is employed within the deposition apparatus and processing method the semiconductor substrate holding apparatus which has a minimum of one tab formed therein, where the tab is positioned above an alignment mark upon the semiconductor substrate such that when forming the blanket conductor metal layer upon the semiconductor substrate held within the semiconductor substrate holding apparatus there is not deposited a blanket conductor metal layer upon the portion of the semiconductor substrate having the alignment mark formed thereupon.

In addition, Wong, in U.S. Pat. No. 5,270,555 discloses a metallization process which provides good metal step coverage while simultaneously providing useful partially replicated alignment marks upon a semiconductor substrate. Through the method, there is formed a cold sputtered aluminum conductor metal layer upon a hot sputtered aluminum conductor metal layer, which hot sputtered aluminum conductor metal layer is first formed upon a semiconductor substrate having an alignment mark formed thereupon. Through the method, the cold sputtered aluminum conductor metal layer redefines the edges of a partially replicated alignment mark formed upon the hot sputtered aluminum conductor metal layer, where the partially replicated alignment mark upon the hot sputtered aluminum conductor metal layer is formed at the location of the alignment mark upon the semiconductor substrate.

Desirable in the art of microelectronics fabrication are additional methods through which the resolution of alignment marks formed upon substrates employed within microelectronic fabrications may be preserved when forming upon those substrates patterned non-transparent layers from blanket non-transparent layers formed upon those substrates. Particularly desirable in the art of microelectronics fabrication are additional methods through which the resolution of alignment marks formed upon substrates, such as semiconductor substrates, employed within microelectronic fabrications, such as integrated circuit fabrications, may be preserved when forming upon those substrates patterned non-transparent layers, such as patterned conductor metal layers, from blanket non-transparent layers, such as blanket conductor metal layers, formed upon those substrates. It is towards the foregoing goals that the present invention is directed.

SUMMARY OF THE INVENTION

A first object of the present invention is to provide a method through which the resolution of an alignment mark formed upon a substrate employed within microelectronics fabrication may be preserved when forming upon the substrate a patterned non-transparent layer from a blanket non-transparent layer formed upon the substrate.

A second object of the present invention is to provide a method in accord with the first object of the present invention, where the substrate is a semiconductor substrate employed within integrated circuit fabrication, the patterned non-transparent layer is a patterned conductor metal layer and the blanket non-transparent layer is a blanket conductor metal layer.

A third object of the present invention is to provide a method in accord with the first object of the present invention or the second object of the present invention, which method is readily manufacturable.

In accord with the objects of the present invention, there is provided by the present invention a method for forming over a substrate employed within microelectronics fabrication a patterned non-transparent layer from a blanket non-transparent layer, while maintaining the resolution of an alignment mark formed upon the substrate. To practice the method of the present invention there is first provided a substrate which has an alignment mark formed upon the substrate. There is then formed over the substrate including the alignment mark a blanket non-transparent layer. The blanket non-transparent layer only partially replicates the alignment mark to form upon the blanket non-transparent layer a partially replicated alignment mark at a location upon the blanket non-transparent layer corresponding with the location of the alignment mark formed upon the substrate. There is then removed through a first photolithographic and etch method a first portion of the blanket non-transparent layer at the location of the partially replicated alignment mark to leave completely exposed the alignment mark upon the substrate while simultaneously forming a partially patterned non-transparent layer. The first photolithographic and etch method employs the partially replicated alignment mark to register a first photolithographic mask with respect to the substrate. Finally, there is then etched through a second photolithographic and etch method the partially patterned non-transparent layer to form a patterned non-transparent layer. The second photolithographic and etch method employs the alignment mark to register a second photolithographic mask with respect to the substrate.

The present invention provides a method through which the resolution of an alignment mark formed upon a substrate employed within microelectronics fabrication may be preserved when forming upon the substrate a patterned non-transparent layer from a blanket non-transparent layer. The method of the present invention achieves this goal by employing a two step photolithographic and etch method for forming from the blanket non-transparent layer the patterned non-transparent layer. Within the first process step of the two step photolithographic and etch method a portion of the blanket non-transparent layer at the location of the alignment mark upon the substrate is removed to leave exposed the alignment mark upon the substrate and simultaneously form a partially patterned non-transparent layer, while employing a partially replicated alignment mark upon the blanket non-transparent layer to register a first photolithographic mask with respect to the substrate. Within the second process step of the two step photolithographic and etch method the partially patterned non-transparent layer is further patterned to yield a patterned non-transparent layer while employing the alignment mark to register a second photolithographic mask with respect to the substrate. Since within the method of the present invention the alignment mark is fully exposed when undertaking the second photolithographic and etching method, the resolution of the alignment mark is preserved when forming upon the substrate the patterned non-transparent layer from the blanket non-transparent layer.

The present invention may be employed where the substrate is a semiconductor substrate employed within integrated circuit fabrication, the patterned non-transparent layer is a patterned conductor metal layer and the blanket non-transparent layer is a blanket conductor metal layer. The method of the present invention does not discriminate with respect to the nature of the substrate, the patterned non-transparent layer or the blanket non-transparent layer. Thus, the method of the present invention may be employed to preserve the resolution of an alignment mark formed upon a semiconductor substrate when forming upon the semiconductor substrate a patterned conductor metal layer from a blanket conductor metal layer.

The method of the present invention is readily manufacturable. Through the method of the present invention there is employed: (1) a first photolithographic and etching method for removing from an alignment mark formed upon a substrate employed within microelectronics fabrication a portion of a blanket non-transparent layer formed over the alignment mark to leave exposed the alignment mark while simultaneously forming a partially patterned non-transparent layer, where the first photolithographic and etching method employs a partially replicated alignment mark upon the blanket non-transparent layer to register a first photomask with respect to the substrate; and (2) a second photolithographic and etching method to form from the partially patterned non-transparent layer a patterned non-transparent layer, where the second photolithographic and etching method employs the alignment mark to register a second photomask with respect to the substrate. Since the method of the present invention employs a successive pair of photolithographic and etching methods which are largely equivalent with the exception of the location and resolution of an alignment mark employed to register a photolithographic mask with respect to the substrate, the method of the present invention is readily manufacturable.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

Figure 1:
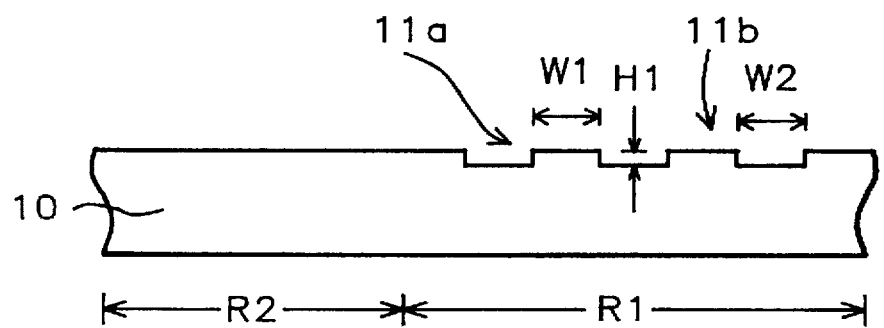
FIG. 1 to FIG. 7 show a series of schematic cross-sectional diagrams illustrating the results of progressive stages in forming upon a semiconductor substrate employed within integrated circuit fabrication a patterned conductor metal layer from a blanket conductor metal layer in accord with the preferred embodiment of the method of the present invention.

The present invention provides a method for preserving the resolution of an alignment mark formed upon a substrate employed within microelectronics fabrication when there is formed from a blanket non-transparent layer formed upon the substrate a patterned non-transpareht layer. The method of the present invention achieves this goal through removing through a first photolithographic and etching method a portion of the blanket non-transparent layer at the location of the alignment mark to leave exposed the alignment mark upon the substrate while simultaneously forming a partially patterned non-transparent layer over the substrate, where the first photolithographic and etch method employs a partially replicated alignment mark formed upon the blanket non-transparent layer at the location of the alignment mark upon the substrate to register a first photolithographic mask with respect to the substrate. There is then employed a second photolithographic and etching method to form from the partially patterned non-transparent layer a patterned non-transparent layer, where the second photolithographic and etching method employs the alignment mark to register a second photolithographic mask with respect to the substrate.

Although the preferred embodiment of the method of the present invention illustrates the method of the present invention employed in forming upon a semiconductor substrate employed within integrated circuit fabrication a patterned conductor metal layer from a blanket conductor metal layer, it is understood by a person skilled in the art that substrates upon which may be formed through the method of the present invention patterned non-transparent layers, such as but not limited to patterned conductor metal layers, from blanket non-transparent layers, such as but not limited to blanket conductor metal layers, may also include but are not limited to: (1) semiconductor substrates employed within solar cell fabrication; and (2) ceramic substrates, such as but not limited to ceramic substrates employed within integrated circuit packaging. As is similarly understood by a person skilled in the art, such substrates, in general including but not limited to semiconductor substrates and ceramic substrates, may have formed therein and/or thereupon various active or passive electrical circuit elements as are known in the art, such active or passive electrical circuit elements including but not limited to transistors, resistors, capacitors and diodes.

Within the general method of the present invention, substrates upon which may be formed patterned non-transparent layers from blanket non-transparent layers through the method of the present invention may be substrates chosen from the general groups of substrates including but not limited to conductor substrates, semiconductor substrates and insulator substrates. Similarly, within the general method of the present invention, the blanket non-transparent layers from which are formed the patterned non-transparent layers may be chosen from the general groups of blanket non-transparent layers including but not limited to blanket non-transparent conductor layers, blanket non-transparent semiconductor layers and blanket non-transparent insulator layers.

Within the context of the present invention, transparency or non-transparency of a blanket layer is, as is understood by a person skilled in the art, determined with respect to a wavelength of light employed in registering a photolithographic mask with respect to a substrate upon which is desired to form a patterned layer from the blanket layer.

Referring now to FIG. 1 to FIG. 7, there is shown a series of schematic cross-sectional diagrams illustrating the results of progressive stages in forming upon a semiconductor substrate employed within integrated circuit fabrication a patterned conductor metal layer from a blanket conductor metal layer in accord with the preferred embodiment of the method of the present invention. Shown in FIG. 1 is a schematic cross-sectional diagram of the semiconductor substrate at an early stage in fabrication of the patterned conductor metal layer.

Shown in FIG. 1 is a semiconductor substrate 10 having formed upon the semiconductor substrate 10 a pair of alignment marks 11a and 11b which are employed in registering a series of photolithographic masks with respect to the semiconductor substrate 10 when forming upon the semiconductor substrate 10 a series of patterned layers from a series of blanket layers formed upon the semiconductor substrate 10. As is understood by a person skilled in the art, alignment marks when formed within and/or upon substrates such as the semiconductor substrate 10 are often formed as greater than two multiple plateaus and/or troughs within and/or upon the substrates. Thus, while FIG. 1 illustrates the pair of alignment marks 11a and 11b, formed within the semiconductor substrate 10, it is common in the art that substrates will typically have greater than two alignment marks formed therein or thereupon. As is illustrated in FIG. 1, the semiconductor substrate 10 is divided into a first region R1 of the semiconductor substrate 10 having the pair of alignment marks 11a and 11b formed thereupon and a second region R2 of the semiconductor substrate 10 absent the pair of alignment marks 11a and 11b. Although not specifically illustrated within the schematic cross-sectional diagram of FIG. 1, there is typically and preferably formed within and/or upon the second region R2 of the semiconductor substrate 10 electrical circuit elements such as but not limited to transistors, resistors, capacitors and diodes.

As is additionally illustrated in FIG. 1, each alignment mark 11a or 11b within the pair of alignment marks 11a and 11b has a depth H1 within the semiconductor substrate 10. Typically and preferably, the depth H1 is about 1200 angstroms. Similarly, as is also illustrated in FIG. 1, each alignment mark 11a or 11b within the pair of alignment marks 11a and 11b has a width W1 upon the semiconductor substrate 10 and each alignment mark within the pair of alignment marks 11a and 11b is separated from an adjoining plateau within the semiconductor substrate 10 by a width W2 upon the semiconductor substrate. Typically and preferably, the width W1 and the width W2 are each about 8 microns. Although FIG. 1 illustrates the pair of alignment marks 11a and 11b as trenches formed within the semiconductor substrate 10, it is understood by a person skilled in the art that functionally equivalent alignment marks may also be formed as protusions upon a substrate, such as the semiconductor substrate 10, by appropriate patterning of a blanket layer formed upon the substrate. Within both the method of the present invention and the preferred embodiment of the method of the present invention, alignment marks when described as formed "upon" a substrate are intended to include alignment marks formed as trenches within a substrate as well as alignment marks formed as patterned layer protusions upon a substrate.

Figure 2:
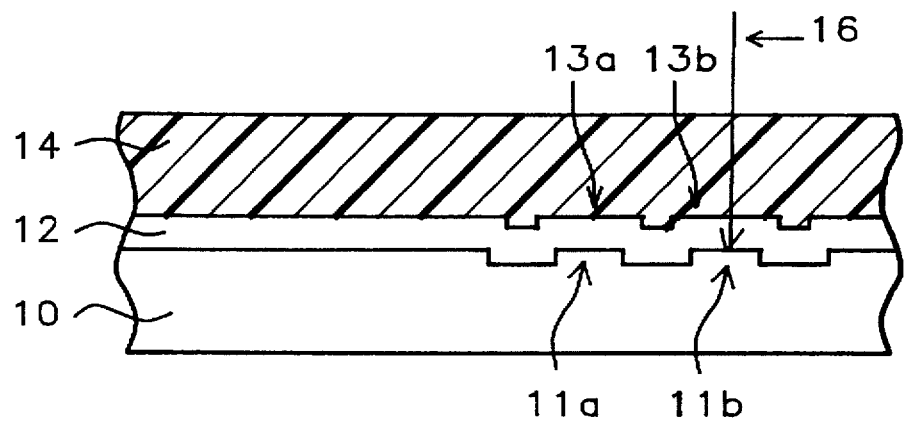

Referring now to FIG. 2, there is shown a schematic cross-sectional diagram illustrating the results of further processing of the semiconductor substrate 10 whose schematic cross-sectional diagram is illustrated in FIG. 1. Shown in FIG. 2 is a schematic cross-sectional diagram of the semiconductor substrate 10 otherwise equivalent to the semiconductor substrate 10 whose schematic cross-sectional diagram is illustrated in FIG. 1, but upon which there is formed: (1) a blanket transparent layer 12 in contact with the semiconductor substrate 10; and (2) a blanket first photoresist layer 14 formed upon the blanket transparent layer 12. Each one of the blanket transparent layer 12 and the blanket first photoresist layer 14 may be formed through methods and materials as are conventional in the art. Within the preferred embodiment of the method of the present invention, the blanket transparent layer 12 is typically and preferably formed of a transparent dielectric material chosen from the group of transparent dielectric materials including but not limited to silicon oxide transparent dielectric materials, silicon nitride transparent dielectric materials and silicon oxynitride transparent dielectric materials. Similarly, the blanket transparent layer 12 may be formed through methods as are conventional in the art, including but not limited to thermal chemical vapor deposition (CVD) methods, plasma enhanced chemical vapor deposition (PECVD) methods and physical vapor deposition (PVD) sputtering methods. Preferably, the thickness of the blanket transparent layer 12 is from about 5000 to about 8000 angstrems. As is illustrated in FIG. 2, the blanket transparent layer 12 is typically formed conformally upon the semiconductor substrate 10 and therefore at least partially replicates the pair of alignment marks 11a and 11b within the semiconductor substrate 10, thus forming within the blanket transparent layer 12 a pair of partially replicated alignment marks 13a and 13b at a location substantially corresponding with the location of the pair of alignment marks 11a and 11b within the semiconductor substrate 10.

With respect to the blanket first photoresist layer 14, the blanket first photoresist layer 14 may be formed from any of several photoresist materials as are known in the art of integrated circuit fabrication, including but not limited to photoresist materials selected from the general groups of photoresist materials including but not limited to positive photoresist materials and negative photoresist materials. For the preferred embodiment of the method of the present invention, the blanket first photoresist layer 14 is preferably formed of a positive novolak photoresist material from which there may readily be formed patterned photoresist layer features with optimal uniformity and stability at sub-micron linewidths and pitch. Preferably, the blanket first photoresist layer 14 is from about 0.8 to about 1.0 microns angstroms thick.

Finally, there is shown in FIG. 2 the presence of a photomask alignment centerline light beam 16 which is employed when registering a first photolithographic mask (not shown) with respect to the semiconductor substrate 10 in the process of photoexposing and developing portions of the blanket first photoresist layer 14. As is illustrated by FIG. 2, due to the transparency of the blanket transparent layer 12 the photomask alignment centerline light beam 16 impinges directly upon the alignment mark 11b, thus allowing optimal and direct alignment of the semiconductor substrate 10 with respect to the first photolithographic mask employed in patterning the blanket first photoresist layer 14.

Figure 3:
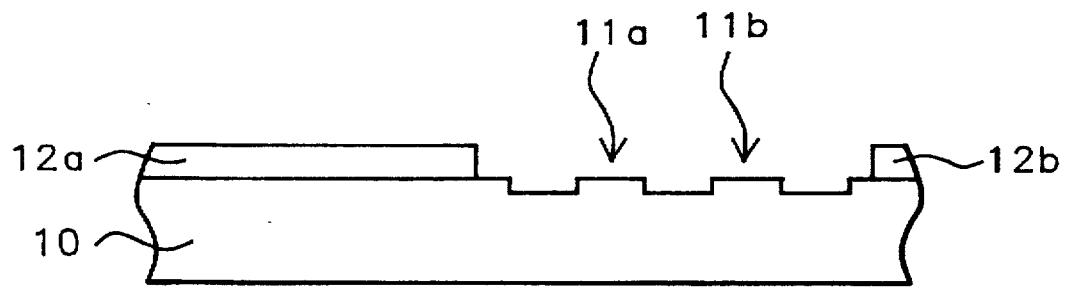

Referring now to FIG. 3, there is shown a schematic cross-sectional diagram illustrating the results of further processing of the semiconductor substrate 10 whose schematic cross-sectional diagram is illustrated in FIG. 2. Shown in FIG. 3 is a schematic cross-sectional diagram of the semiconductor substrate 10 as illustrated in FIG. 2, but wherein: (1) the blanket first photoresist layer 14 has been photoexposed and developed to form a patterned first photoresist layer (not shown); (2) the patterned first photoresist layer is employed as a patterned first photoresist etch mask layer in forming a pair of patterned transparent layers 12a and 12b from the blanket transparent layer 12; and (3) the patterned first photoresist layer has then been removed from the semiconductor substrate 10. Each of the foregoing three process steps in providing the semiconductor substrate 10 whose schematic cross-sectional diagram is illustrated in FIG. 3 may be undertaken through methods as are conventional in the art of integrated circuit fabrication. Typically and preferably, the blanket first photoresist layer 14 is photoexposed and subsequently developed to form the patterned first photoresist layer within a developer, most typically a wet chemical developer solution, appropriate to photoresist material from which is formed the blanket first photoresist layer 14. Similarly, the blanket transparent layer 12 is then etched to form the patterned transparent layers 12a and 12b while employing the patterned first photoresist layer a patterned first photoresist etch mask layer, typically and preferably through etch methods including but not limited to reactive ion etch (RIE) dry plasma etch methods and wet chemical etch methods employing etchants appropriate to the material from which is formed the transparent layer 12. Finally, the patterned first photoresist layer employed as the patterned first photoresist etch mask layer is then typically and preferably stripped from the patterned transparent layers 12a and 12b through a wet chemical stripping method or a dry plasma stripping method as is known in the art of integrated circuit fabrication.

Figure 4:
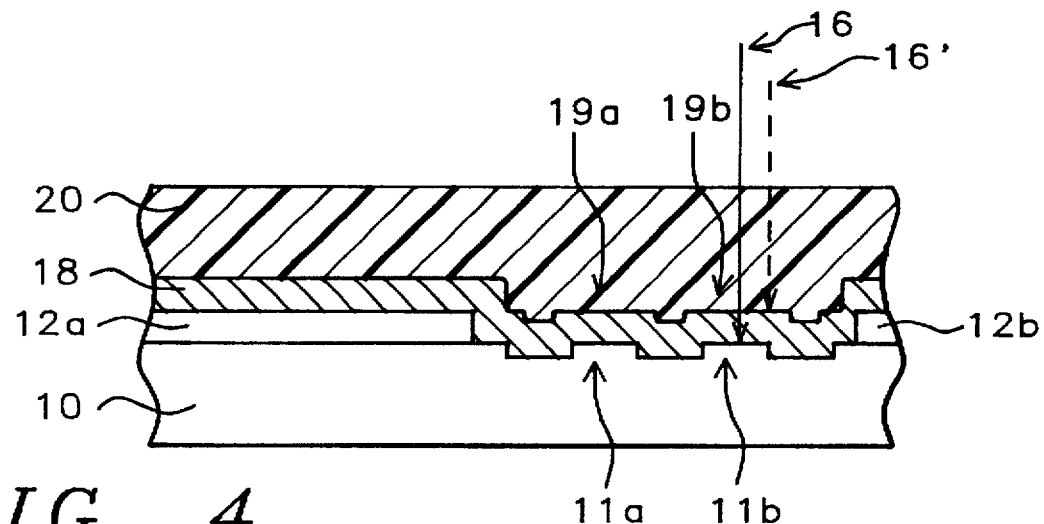

Referring now to FIG. 4, there is shown a schematic cross-sectional diagram illustrating the results of further processing of the semiconductor substrate 10 whose schematic cross-sectional diagram is illustrated in FIG. 3. Shown in FIG. 4 is a schematic cross-sectional diagram of the semiconductor substrate 10 otherwise equivalent to the semiconductor substrate 10 whose schematic cross-sectional diagram is illustrated in FIG. 3, but upon whose surface has been formed: (1) a blanket conductor metal layer 18 in contact with the patterned transparent layers 12a and 12b and a portion of the semiconductor substrate including the alignment marks 11a and 11b; and (2) a blanket second photoresist layer 20 formed upon the blanket conductor metal layer 18.

Within the preferred embodiment of the method of the present invention, the blanket conductor metal layer 18 may be formed from any of several conductor metals, including but not limited to aluminum, aluminum alloy, copper, copper alloy, tungsten, tungsten alloy, titanium and titanium alloy conductor metals. Within the preferred embodiment of the method of the present invention, the blanket conductor metal layer 18 is preferably formed of a conductor metal formed at least in part of aluminum or an aluminum alloy conductor metal. Preferably, the blanket conductor metal layer 18 is from about 4000 to about 8000 angstroms thick.

With respect to the blanket second photoresist layer 20, within the preferred embodiment of the method of the present invention the blanket second photoresist layer 20 is preferably formed through methods, materials and dimensions analogous or equivalent to the methods, materials and dimensions employed in forming the blanket first photoresist layer 14. It will nonetheless also be understood by a person skilled in the art that in general within the method of the present invention and in particular within the preferred embodiment of the method of the present invention the blanket second photoresist layer 20 need not necessarily be formed of a photoresist material from which may be formed a patterned photoresist layer possessing the optimal stability or uniformity characteristics of the patterned first photoresist layer which is formed from the blanket first photoresist layer 14.

As is additionally illustrated by the schematic cross-sectional diagram of FIG. 4, the blanket conductor metal layer 18 has formed thereupon a pair of partially replicated alignment marks 19a and 19b corresponding with the locations of the alignment marks 11a and 11b formed upon the semiconductor substrate 10. Within integrated circuit fabrication, the partially replicated alignment marks 19a and 19b typically will not exactly replicate laterally upon the blanket conductor metal layer 18 the corresponding locations of the alignment marks 11a and 11b formed upon the semiconductor substrate 10. A lateral (ie: horizontal) dislocation of the centers of the partially replicated alignment marks 19a and 19b with respect to the centers of the alignment marks 11a and 11b is typical within integrated circuit fabrication due to inherent manufacturing process inhomogeneities in forming blanket conductor metal layers, such as the blanket conductor metal layer 18 upon semiconductor substrates, such as the semiconductor substrate 10. Thus, it is also typical within the preferred embodiment of the method of the present invention that the partially replicated alignment mark 19b will have an apparent photomask alignment centerline light beam 16' which is laterally displaced from the photomask alignment centerline light beam 16 which corresponds with the alignment mark 11b, as illustrated in FIG. 4.

Due to non-transparency of the blanket conductor metal layer 18, the photomask alignment centerline light beam 16 is not accessible when registering a second photolithographic mask (not shown) with respect to the semiconductor substrate 10. Only the apparent photomask alignment centerline light beam 16' may be employed under such circumstances. Thus, absent the method of the present invention there is conventionally observed non-optimal overlay registration of patterned non-transparent layers formed incident to registration of photolithographic masks with respect to substrates, such as the semiconductor substrate 10, when employing apparent photomask alignment centerline light beams, such as the apparent photomask alignment centerline light beam 16', rather than photomask alignment centerline light beams, such as the photomask alignment centerline light beam 16.

Figure 5:
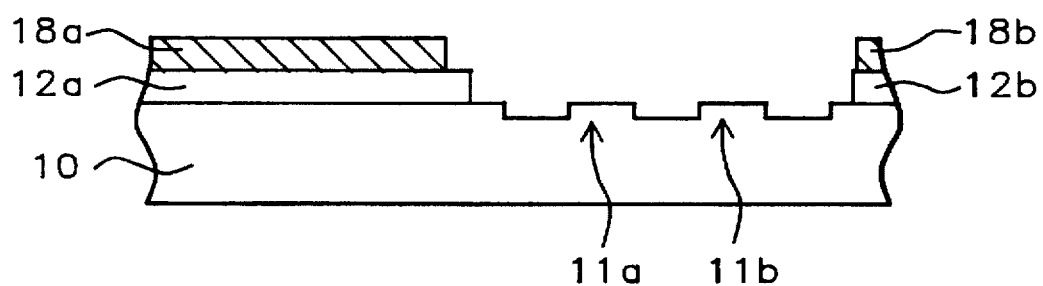

Referring now to FIG. 5, there is shown a schematic cross-sectional diagram illustrating the results of further processing of the semiconductor substrate 10 whose schematic cross-sectional diagram is illustrated in FIG. 4. Shown in FIG. 5 is a schematic cross-sectional diagram of the semiconductor substrate 10 as illustrated in FIG. 4, but wherein: (1) the blanket second photoresist layer 20 has been photoexposed and developed to form a patterned second photoresist layer (not shown); (2) the patterned second photoresist layer has been employed as a patterned second photoresist etch mask layer when removing a portion of the blanket conductor metal layer 18 from the semiconductor substrate 10 at the location of the pair of alignment marks 11a and 11b, thus simultaneously forming a pair of partially patterned conductor metal layers 18a and 18b; and (3) the patterned second photoresist layer has then been removed from the semiconductor substrate 10. The foregoing three process steps are preferably undertaken through methods and materials analogous or equivalent to the methods and materials employed in forming from the blanket transparent layer 12 as illustrated in FIG. 2 the patterned transparent layers 12a and 12b as illustrated in FIG. 3, with the exception that a second photolithographic mask (not shown) is registered with respect to the semiconductor substrate 10 through the apparent photomask alignment centerline light beam 16' rather than the inaccessible photomask alignment centerline light beam 16. Thus, the partially patterned conductor metal layers 18a and 18b are formed with non-optimal overlay registration with respect to the substrate 10 and the intervening corresponding patterned transparent layers 12a and 12b.

Figure 6:
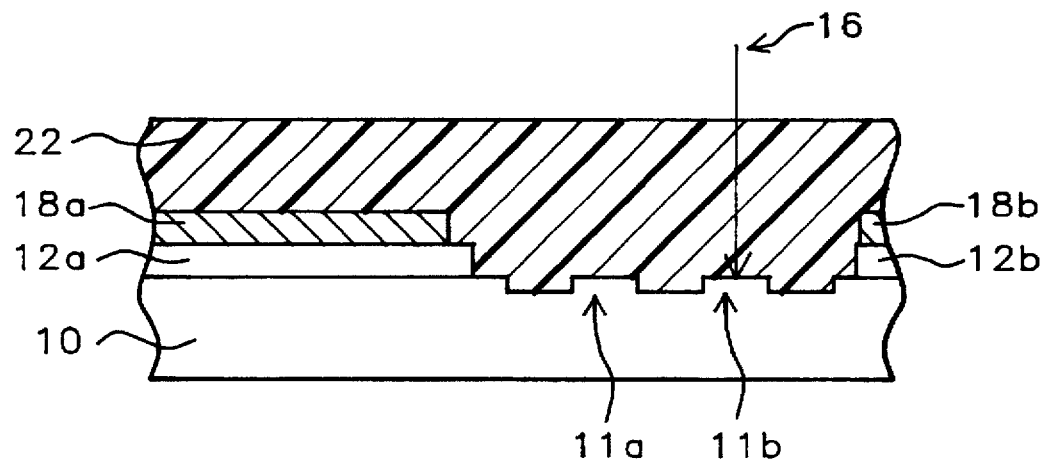

Referring now to FIG. 6, there is shown a schematic cross-sectional diagram illustrating the results of further processing of the semiconductor substrate 10 whose schematic cross-sectional diagram is illustrated in FIG. 5. Shown in FIG. 6 is the semiconductor substrate 10 otherwise equivalent to the semiconductor substrate 10 whose schematic cross-sectional diagram is illustrated in FIG. 5, but upon whose surface is formed a blanket third photoresist layer 22. The blanket third photoresist layer 22 is preferably formed through methods, materials and dimensions analogous or equivalent to the methods, materials and dimensions preferably employed in forming the blanket first photoresist layer 14 as illustrated in FIG. 2 or the blanket second photoresist layer 20 illustrated in FIG. 4. As is illustrated in FIG. 6, due to removal of the portion of the blanket conductor metal layer 18 formed upon the alignment marks 11a and 11b, the photomask alignment centerline light beam 16 when employed to align the semiconductor substrate 10 whose schematic cross-sectional diagram is illustrated in FIG. 6 with a third photomask (not shown) may be aligned directly to the alignment mark 11b, thus providing optimal overlay registration of the third photomask with respect to the semiconductor substrate 10.

Figure 7:
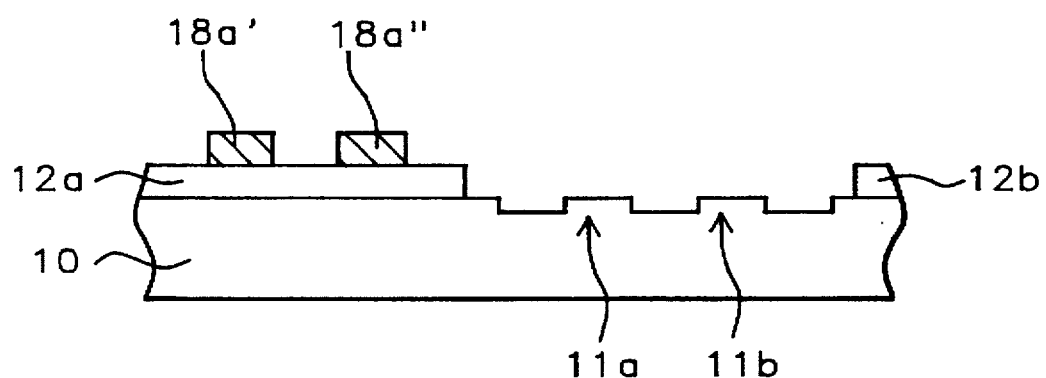

Referring now to FIG. 7, there is shown a schematic cross-sectional diagram illustrating the results of further processing of the semiconductor substrate 10 whose schematic cross-sectional diagram is illustrated in FIG. 6. Shown in FIG. 7 is the results of: (1) forming from the blanket third photoresist layer 22 a patterned third photoresist layer (not shown); (2) employing the patterned third photoresist layer as a patterned third photoresist etch mask layer in forming from the partially patterned conductor metal layer 18a the patterned conductor metal layers 18a' and 18a"; and (3) removing the patterned third photoresist layer from the semiconductor substrate. The foregoing three process steps are preferably undertaken through methods and materials analogous or equivalent to the methods and materials employed in forming from the blanket conductor metal layer 18 as illustrated in FIG. 4 the partially patterned conductor metal layers 18a and 18b as illustrated in FIG. 5, with the exception that the third photolithographic mask is registered with respect to the semiconductor substrate 10 through the photomask alignment centerline light beam 16 contacting the alignment mark 11b rather than the apparent photomask alignment centerline light beam 16' contacting the partially replicated alignment mark 19b. Thus, through the preferred embodiment of the method of the present invention there is provided patterned conductor metal layers 18a' and 18a" with optimal overlay registration with respect to the semiconductor substrate 10, as well as any additional patterned layers intervening the semiconductor substrate 10 and the patterned conductor metal layers 18a' and 18a".

EXAMPLES

Two semiconductor substrates employed within 0.45 micron linewidth static random access memory (SRAM) integrated circuit fabrication were generally fabricated in accord with the methods and materials outlined within the foregoing Description of the Preferred Embodiment. Each of the two semiconductor substrates had formed therein a series of alignment marks in accord with the preferred embodiment of the method of the present invention.

Upon each of the two semiconductor substrates including the series of alignment marks was formed a blanket transparent layer. Each blanket transparent layer was formed conformally to a thickness of about 5600 angsttoms from a boro-phospho-silicate-glass (BPSG) insulator material deposited through a chemical vapor deposition (CVD) method employing tetra-ethyl-ortho-silicate (TEOS) as a silicon source material, along with suitable phosphorus and boron source materials. Thus, there was formed within each blanket transparent layer a series of partially replicated alignment marks at a location corresponding substantially with the location of the series of alignment marks within each semiconductor substrate.

The blanket transparent layer upon one of the two semiconductor substrates was then patterned, employing a photoexposed and developed blanket photoresist layer formed to a thickness of about 0.92 microns, to expose the series of alignment marks upon the semiconductor substrate. The blanket transparent layer upon the other of the two semiconductor substrates remained unpatterned and thus covered the series of alignment marks upon that semiconductor substrate and left remaining the series of partially replicated alignment marks within the blanket transparent layer substantially corresponding with the location of the series of alignment marks within the semiconductor substrate.

Upon each of the two semiconductor substrates was then formed a blanket non-transparent layer formed of a blanket composite conductor metal stack layer consisting of: (1) a barrier metal layer of about 100 angstroms titanium metal having formed thereupon; (2) a conductor metal layer of about 4000 angstroms of aluminum-copper alloy in turn having formed thereupon; (3) an anti-reflective layer of about 250 angstroms of titanium nitride. Within the blanket non-transparent layer was formed a series of twice replicated alignment marks substantially corresponding either directly or indirectly with the location of the series of alignment marks within the semiconductor substrate. Each of the two blanket non-transparent layers was subsequently patterned, employing photoexposed and developed blanket photoresist layers formed to a thickness of about 1.65 microns, to form a series of patterned non-transparent layers upon each of the semiconductor substrates. Portions of the blanket non-transparent layer upon each of the semiconductor substrates were patterned employing a one-step photolithographic method conventional in the art of integrated circuit fabrication, while other portions of the blanket non-transparent layers upon each of the semiconductor substrates were patterned employing the two-step photolithographic method in accord with the preferred embodiment of the method of the present invention.

When patterning the blanket non-transparent layers upon each of the two semiconductor substrates there was determined for a series of 26 randomly distributed exposure fields upon each of the two semiconductor substrates: (1) a first overlay deviation corresponding with forming a patterned non-transparent layer from the blanket non-transparent layer through the one-step photolithographic method conventional in the art of integrated circuit fabrication; and (2) a second overlay deviation corresponding with forming a patterned non-transparent layer from the blanket non-transparent layer through the two-step photolithographic method in accord with the preferred embodiment of the method of the present invention. Each of the preceding two overlay deviations was determined for both an X direction within the plane of the semiconductor substrate and a perpendicular Y direction also within the plane of the semiconductor substrate. The results of the measured overlay deviations, reported as 3 sigma deviation values (ie: three standard deviation values) are reported in Table I.

TABLE I

| Wafer # | Substrate | O/L Dev.-1 Step | O/L Dev.-2 Step | Delta Dev. |
|---|---|---|---|---|
| 1 | No BPSG | X = 95 nm | X = 50 nm | −45 nm |
|   |   | Y = 86 nm | Y = 52 nm | −34 nm |
| 2 | BPSG | X = 134 nm | X = 51 nm | −83 nm |
|   |   | Y = 120 nm | Y = 77 nm | −43 nm |

As is seen from review of the data in Table I, under all circumstances of calculated X and Y overlay deviation, the two-step non-transparent layer patterning method in accord with the preferred embodiment of the method of the present invention provided a smaller overlay deviation in comparison with an overlay deviation corresponding with a one-step non-transparent layer patterning method conventional in the art of integrated circuit fabrication.

As is understood by a person skilled in the art, the preferred embodiment and examples of the method of the present invention are illustrative of the method of the present invention rather than limiting of the method of the present invention. Revisions and modifications may be made to methods, materials, structures and dimensions through which is practiced the preferred embodiment and examples of the method of the present invention while still providing embodiments and examples which are within the spirit and scope of the method of the present invention, as defined by the accompanying claims.

What is claimed is:

1. A method for forming a patterned non-transparent layer over a substrate comprising:

providing a substrate, the substrate having an alignment mark formed thereupon;

forming over the substrate including the alignment mark a blanket non-transparent layer, the blanket non-transparent layer only partially replicating the alignment mark to form upon the blanket non-transparent layer a partially replicated alignment mark at a location substantially corresponding with the location of the alignment mark formed upon the substrate;

removing through a first photolithographic and etch method a first portion of the blanket non-transparent layer to leave completely exposed the alignment mark while simultaneously forming a partially patterned non-transparent layer, the first photolithographic and etch method employing the partially replicated alignment mark to register a first photolithographic mask with respect to the substrate; and patterning then through a second photolithographic and etch method the partially patterned non-transparent layer to form a patterned non-transparent layer, the second photolithographic and etch method employing the alignment mark to register a second photolithographic mask with respect to the substrate.

2. The method of claim 1 wherein the substrate is chosen from the group of substrates consisting of conductor substrates, semiconductor substrates and insulator substrates.

3. The method of claim 1 wherein the blanket non-transparent layer is chosen from the group of blanket non-transparent layers consisting of blanket non-transparent conductor layers, blanket non-transparent semiconductor layers and blanket non-transparent insulator layers.

4. A method for forming a patterned non-transparent layer over a substrate comprising:

providing a substrate, the substrate having an alignment mark formed thereupon;

forming over the substrate including the alignment mark a blanket transparent layer, the blanket transparent layer at least partially replicating the alignment mark to form upon the blanket transparent layer a partially replicated alignment mark at a location substantially corresponding with the location of the alignment mark formed upon the substrate;

forming upon the blanket transparent layer including the partially replicated alignment mark a blanket non-transparent layer, the blanket non-transparent layer only partially replicating the partially replicated alignment mark to form upon the blanket non-transparent layer a twice partially replicated alignment mark at a location substantially corresponding with the location of the alignment mark formed upon the substrate;

removing through a first photolithographic and etch method a first portion of the blanket non-transparent layer to leave completely exposed the partially replicated alignment mark while simultaneously forming a partially patterned non-transparent layer, the first photolithographic and etch method employing the twice partially replicated alignment mark to register a first photolithographic mask with respect to the substrate; and patterning then through a second photolithographic and etch method the partially patterned non-transparent layer to form a patterned non-transparent layer, the second photolithographic and etch method employing the alignment mark to register a second photolithographic mask with respect to the substrate.

5. The method of claim 4 wherein the substrate is chosen from the group of substrates consisting of conductor substrates, semiconductor substrates and insulator substrates.

6. The method of claim 4 wherein the blanket transparent layer is formed from a transparent dielectric material.

7. The method of claim 4 wherein the blanket non-transparent layer is chosen from the group of blanket non-transparent layers consisting of blanket non-transparent conductor layers, blanket non-transparent semiconductor layers and blanket non-transparent insulator layers.

8. A method for forming a patterned conductor metal layer over a semiconductor substrate comprising:

providing a semiconductor substrate, the semiconductor substrate having an alignment mark formed thereupon;

forming over the semiconductor substrate including the alignment mark a blanket conductor metal layer, the blanket conductor metal layer only partially replicating the alignment mark to form upon the blanket conductor metal layer a partially replicated alignment mark at a location substantially corresponding with the location of the alignment mark formed upon the semiconductor substrate;

removing through a first photolithographic and etch method a first portion of the blanket conductor metal layer to leave completely exposed the alignment mark while simultaneously forming a partially patterned conductor metal layer, the first photolithographic and etch method employing the partially replicated alignment mark to register a first photolithographic mask with respect to the semiconductor substrate; and etching then through a second photolithographic and etch method the partially patterned conductor metal layer to form a patterned conductor metal layer, the second photolithographic and etch method employing the alignment mark to register a second photolithographic mask with respect to the semiconductor substrate.

9. The method of claim 8 wherein the alignment mark has a depth within the semiconductor of about 1200 angstroms and the alignment mark has a width upon the semiconductor substrate of about 8 microns.

10. The method of claim 8 wherein the blanket conductor metal layer has a thickness of from about 4000 to about 8000 angstroms.

11. The method of claim 8 wherein the blanket conductor metal layer is formed from a conductor metal chosen from the group of conductor metals consisting of aluminum, aluminum alloy, copper, copper alloy, tungsten, tungsten alloy, titanium and titanium alloy conductor metals.

12. A method for forming a patterned conductor metal layer over a semiconductor substrate comprising:

providing a semiconductor substrate, the semiconductor substrate having an alignment mark formed thereupon;

forming over the semiconductor substrate including the alignment mark a blanket transparent layer, the blanket transparent layer at least partially replicating the alignment mark to form upon the blanket transparent layer a partially replicated alignment mark at a location substantially corresponding with the location of the alignment mark formed upon the semiconductor substrate;

forming over the blanket transparent layer including the partially replicated alignment mark a blanket conductor metal layer, the blanket conductor metal layer only partially replicating the partially replicated alignment mark to form upon the blanket conductor metal layer a twice partially replicated alignment mark at a location substantially corresponding with the location of the alignment mark formed upon the semiconductor substrate;

removing through a first photolithographic and etch method a first portion of the blanket conductor metal layer to leave completely exposed the partially replicated alignment mark while simultaneously forming a partially patterned conductor metal layer, the first photolithographic and etch method employing the twice partially replicated alignment mark to register a first photolithographic mask with respect to the semiconductor substrate; and etching then through a second photolithographic and etch method the partially patterned conductor metal layer to form a patterned conductor metal layer, the second photolithographic and etch method employing the alignment mark to register a second photolithographic mask with respect to the semiconductor substrate.

13. The method of claim 12 wherein the alignment mark has a depth within the semiconductor of about 1200 angstroms and the alignment mark has a width upon the semiconductor substrate of about 8 microns.

14. The method of claim 12 wherein the blanket transparent layer is formed of a transparent dielectric layer formed to a thickness of from about 5000 to about 8000 angstroms.

15. The method of claim 12 wherein the blanket conductor metal layer has a thickness of from about 4000 to about 8000 angstroms.

16. The method of claim 12 wherein the blanket conductor metal layer is formed from a conductor metal chosen from the group of conductor metals consisting of aluminum, aluminum alloy, copper, copper alloy, tungsten, tungsten alloy, titanium and titanium alloy conductor metals.

* * * * *